(12) United States Patent
Marksteiner

(10) Patent No.: US 10,164,601 B2
(45) Date of Patent: Dec. 25, 2018

(54) BAW RESONATOR HAVING TEMPERATURE COMPENSATION

(71) Applicant: Snaptrack Inc., San Diego, CA (US)

(72) Inventor: Stephan Marksteiner, Neubiburg (DE)

(73) Assignee: SnapTrack, Inc., San Diego, CA (US)

( * ) Notice: Subject to any disclaimer, the term of this patent is extended or adjusted under 35 U.S.C. 154(b) by 269 days.

(21) Appl. No.: 15/120,810

(22) PCT Filed: Feb. 12, 2015

(86) PCT No.: PCT/EP2015/052965
§ 371 (c)(1),
(2) Date: Aug. 23, 2016

(87) PCT Pub. No.: WO2015/135717
PCT Pub. Date: Sep. 17, 2015

(65) Prior Publication Data
US 2016/0365842 A1 Dec. 15, 2016

(30) Foreign Application Priority Data
Mar. 11, 2014 (DE) .................. 10 2014 103 229

(51) Int. Cl.
*H03H 9/02* (2006.01)
*H03H 9/17* (2006.01)
*H03H 9/54* (2006.01)

(52) U.S. Cl.
CPC .......... *H03H 9/02102* (2013.01); *H03H 9/17* (2013.01); *H03H 9/175* (2013.01); *H03H 9/54* (2013.01)

(58) Field of Classification Search
CPC ...... H03H 9/02102; H03H 9/17; H03H 9/175; H03H 9/54

(Continued)

(56) References Cited

U.S. PATENT DOCUMENTS

2004/0135144 A1 7/2004 Yamada et al.
2005/0068124 A1 3/2005 Stoemmer
(Continued)

FOREIGN PATENT DOCUMENTS

DE 102006046278 A1 4/2008
JP 2002344279 A 11/2002
(Continued)

OTHER PUBLICATIONS

Lakin, K., "Thin Film Resonator Technology," IEEE Transactions on Ultrasonics, Ferroelectrics and Frequency Control, vol. 52, No. 5, May 2005, pp. 707-716.
(Continued)

*Primary Examiner* — Thomas Dougherty
(74) *Attorney, Agent, or Firm* — Patterson & Sheridan, L.L.P.

(57) ABSTRACT

A temperature-compensated BAW resonator is disclosed. In an embodiment, the BAW includes a substrate and a layer stack disposed thereon, the layer stack including a bottom electrode layer, a top electrode layer, a piezoelectric layer arranged between the bottom and top electrode layers and an acoustic mirror arranged between the bottom electrode layer and the substrate, wherein the acoustic mirror comprises at least two mirror layers, wherein the acoustic mirror comprises high impedance and low impedance layers arranged in an alternating sequence. The layer stack further includes a compensation layer including a material having a positive temperature coefficient of viscoelastic properties, wherein the compensation layer is arranged between the acoustic mirror and the bottom electrode layer, wherein the mirror layers together form a Bragg mirror.

14 Claims, 2 Drawing Sheets

(58) Field of Classification Search
USPC .......................................... 310/311, 322, 365
See application file for complete search history.

(56) References Cited

U.S. PATENT DOCUMENTS

| | | | |
|---|---|---|---|
| 2005/0174014 A1 | 8/2005 | Korden et al. | |
| 2006/0267710 A1* | 11/2006 | Matsumoto | H03H 9/02086 333/187 |
| 2008/0296529 A1 | 12/2008 | Akiyama et al. | |
| 2013/0049544 A1 | 2/2013 | Yokoyama | |
| 2014/0232486 A1* | 8/2014 | Burak | H03H 9/175 333/187 |
| 2015/0162523 A1* | 6/2015 | Umeda | H01L 41/0478 310/331 |
| 2015/0311046 A1* | 10/2015 | Yeh | H01J 37/3405 204/192.17 |

FOREIGN PATENT DOCUMENTS

| JP | 2004235886 A | 8/2004 |
|---|---|---|
| JP | 2007181147 A | 7/2007 |
| JP | 2008160630 A | 7/2008 |
| JP | 2009010926 A | 1/2009 |
| JP | 2013046111 A | 3/2013 |

OTHER PUBLICATIONS

Ohta, S. et al., "Temperature Characteristics of Solidly Mounted Piezoelectric Thin Film Resonators," 2003 IEEE Symposium on Ultrasonics, vol. 2, Oct. 5-8, 2003, pp. 2011-2015.
Petit, D. et al., "Temperature Compensated Bulk Acoustic Wave Resonator and its Predictive 1D Acoustic Tool for RF Filtering," 2007 IEEE Ultrasonics Symposium, Oct. 28, 2007, pp. 1243-1246.
"Acoustic Filters," RTT Technology Topic, Sep. 2012, 4 pages.
Zhang et al., "Modeling Thermal Stresses in 3-D IC Interwafer Interconnects," IEEE Transactions on Semiconductor Manufacturing, vol. 19, No. 4, Nov. 2006, pp. 437-448.
International Search Report and Written Opinion—PCT/EP2015/052965—ISA/EPO—dated May 18, 2015.

* cited by examiner

BAW RESONATOR HAVING TEMPERATURE COMPENSATION

This patent application is a national phase filing under section 371 of PCT/EP2015/052965, filed Feb. 12, 2015, which claims the priority of German patent application 10 2014 103 229.2, filed Mar. 11, 2014, each of which is incorporated herein by reference in its entirety.

BACKGROUND

The increasing number of frequency bands approved for modern cellular phones and other wireless applications has the effect that the individual radio systems are moving closer and closer together in the frequency spectrum. Cleanly separating adjacent frequency bands requires steep-edge filters, i.e. filters whose passband in the direction of an adjacent passband of a different radio system rapidly undergoes transition to a sufficient damping.

Besides closely adjacent radio bands which have to be separated from one another in the telephone terminal, a further problem that arises in the filters is production-dictated frequency variations which make it even more difficult to cleanly separate adjacent frequency bands. In this regard, in modern production standards, in general, a manufacturing tolerance in the range of 800 to 1500 ppm should be expected, which can affect both sides of the passband. In the worst case, therefore, the gap between two adjacent frequency bands is narrowed from both sides by unfavorably positioned manufacturing tolerances.

A further frequency shift arises in the case of temperature changes since the resonant frequency of acoustic resonators such as are usually used in filters changes with temperature. This change is described by the so-called TCF (Temperature Coefficient of Frequency) in ppm/K. The TCF of a BAW resonator e.g. is dependent on the temperature coefficients of the acoustic parameters (speed of sound and impedance) of the respective materials from which the resonator is constructed. To a small extent it is also dependent on the coefficient of thermal expansion of the materials. The TCF of the overall resonator results as a type of weighted average value of the properties of the individual layers, wherein the weighting is proportional to the local stress in the component especially in the BAW resonator. Regions having high stress should be weighted more highly than regions having low stress. The effective TCF is thus determined by the detailed construction of the layer stack in the resonator.

Cellular phones are usually specified to a temperature range of −35 to +85° C. Within this temperature interval a frequency margin of approximately 3000 ppm results for the acoustic resonators used in filters having a typical TCF of −25 ppm/K. A filter which takes account of this frequency margin has to be implemented with an extremely steep-edged design in the case of some frequency band combinations since this frequency margin claims a considerable proportion of this frequency gap for itself. In this regard, for example, band 22 has a frequency gap of only 5700 ppm between the TX band and the RX band.

Considerable efforts are therefore being made to reduce or even completely compensate for the temperature coefficient. For this purpose it is known to use acoustic resonators composed of materials which have a positive temperature coefficient of their viscoelastic properties. Upon heating, these materials exhibit an increase in their modulus of elasticity, as a result of which the resonant frequency increases. Since the majority of all materials used in resonators have a negative temperature coefficient of their viscoelastic properties, the temperature coefficients of the different materials can mutually compensate for one another by means of a suitable combination of materials.

BAW resonators constructed directly as a layer stack on a substrate material, so-called SMR-type BAW resonators (SMR=solidly mounted resonator), are usually constructed on an acoustic mirror in which high and low impedance layers alternate and form a Bragg mirror. A Bragg mirror then has an optimum reflection for an acoustic wave having the wavelength $\lambda$ if the individual low and high impedance layers have a thickness of in each case approximately $\lambda/4$.

One possibility for temperature compensation consists in increasing the thickness of the topmost mirror layer of a Bragg mirror, said layer being directly adjacent to the bottom electrode of the resonator and usually consisting of $SiO_2$, beyond the abovementioned standard value of $\lambda/4$. This leads to higher stress densities in the $SiO_2$ layer and thus also to a better temperature compensation, although also to a reduction of the resonant frequency. The latter in turn can be compensated for by a reduction of the layer thickness of the piezoelectric layer of the resonator. Although this achieves a compensation of the TCF, the reduction of the layer thickness of the piezoelectric layer as a consequence also greatly reduces the piezo-coupling, e.g. by approximately 50%.

Alternatively, according to the prior art it is possible to arrange a silicon dioxide layer between the electrodes and the piezoelectric layer and even between sublayers of the piezoelectric layer. In this case, although the degradation of the effective coupling is not as pronounced, it nevertheless reaches approximately 30%. This has the effect that such filters with compensation of the TCF can no longer fulfill the required specifications in many filter applications in the mobile radio sector.

SUMMARY OF THE INVENTION

Embodiments of the invention provide a BAW resonator which has a temperature compensation, but in which the effective coupling is not reduced as greatly as in solutions mentioned.

Embodiments of the invention specifies an SMR-type BAW resonator in which a compensation layer comprising a material having positive temperature coefficients of its viscoelastic properties is arranged between the acoustic mirror and the bottom electrode layer. In order to reduce or entirely compensate for the disadvantages associated with such a compensation layer, the thicknesses of the compensation layer and of the piezoelectric layer are now chosen such that the proportion of the acoustic energy localized in the compensation layer is minimal. This is accomplished according to the invention by virtue of the fact that the thickness of the layer or layers between the topmost high impedance layer and the bottom electrode of the resonator, usually the aggregate layer thickness of low impedance layer and compensation layer, is allowed to deviate greatly from the customary layer thickness—optimum for a Bragg reflector—of one quarter of the acoustic wavelength $\lambda$ and in particular is raised to a value corresponding to an odd multiple of $\lambda/4$. In particular, a layer thickness of at least $\frac{3}{4}\lambda$ is chosen. If it is assumed that the top low impedance layer has a layer thickness of $\lambda/4$, the layer thickness of the compensation layer is then a multiple of $\lambda/2$.

Surprisingly, an optimization with a compensation layer of such a thickness is accomplished with an almost unchanged layer thickness of the piezoelectric layer, thus resulting in an expedient amplitude ratio of the standing wave that builds up in the entire layer stack. In this case, the proportion of the acoustic energy which is localized outside the piezoelectric layer has a minimum proportion.

In contrast thereto it would have been expected that as the thickness of the compensation layer increases, the amplitude proportion or the energy proportion of acoustic energy in the compensation layer rises as well. Compared with a BAW resonator without a compensation layer, a BAW resonator having a compensation layer having the specified layer thickness exhibits only a small reduction of the effective coupling by approximately 10 to 15%. Moreover, the further advantage is afforded that the resonant frequency of the resonator changes only very little as a result of such a thick compensation layer. This change can be corrected by a slight adaptation of the layer thicknesses of electrode layer and/or piezoelectric layer. Furthermore, with this compensation layer a BAW resonator is obtained which can achieve a complete temperature compensation, that is to say which exhibits a TCF of the viscoelastic properties and thus a TCF of the center frequency of zero.

In various embodiments an SMR-type BAW resonator is constructed as a layer stack on a substrate. Said layer stack firstly comprises an acoustic mirror above the substrate. Said acoustic mirror comprises at least two mirror layers, wherein high impedance layers and low impedance layers are arranged in an alternating sequence. The compensation layer is arranged above the acoustic mirror. The bottom electrode layer of the BAW resonator is arranged above the compensation layer. Situated thereabove is the piezoelectric layer and thereabove the top electrode layer.

A preferred material for the compensation layer is $SiO_2$. The latter exhibits a sufficiently high positive temperature coefficient which enables an effective temperature compensation. Furthermore, a compensation layer composed of $SiO_2$ in conjunction with suitable high impedance layers is also effective as a low impedance layer of the acoustic mirror. Topmost low impedance layer and compensation layer can therefore be formed from the same material. However, it is also possible for different materials to be used for the two layers.

Furthermore, the compensation layer and/or the low impedance layer can be formed from $GeO_2$. In addition, both $SiO_2$ and $GeO_2$ can then be enriched with small amounts of F, P or B.

In one embodiment, the piezoelectric layer comprises aluminum nitride as piezoelectric material. In comparison with other piezoelectric materials, aluminum nitride exhibits a relatively low TCF of the viscoelastic properties. Furthermore, aluminum nitride has a relatively high piezoelectric coupling.

In particular, materials having a high density can be used as high impedance layers of the acoustic mirror. Preference is given to metals and in particular heavy metals such as tungsten, molybdenum, rubidium, scandium or tantalum. Gold, platinum and $Ta_2O_5$ are also suitable.

In one embodiment, dielectric layers can be used as low impedance layers. Layers having a relatively low density exhibit a low acoustic impedance. Layers composed of silicon, $SiO_2$, silicon nitride or else organic layers are preferably used, provided that they have a sufficient thermal stability and an insensitivity to moisture.

In one embodiment, the bottom electrode layer of the BAW resonator comprises a material having a higher impedance than aluminum. A better coupling is thus achieved. In one embodiment, in the piezoelectric layer a material is used which, although it has a poorer thermal behavior than aluminum nitride, exhibits a higher piezo-coupling in return.

By way of example, lithium niobate, lithium tantalate, zinc oxide, lead zirconate titanate and sodium potassium niobate can be used. The disadvantageous effect of the poorer thermal behavior (higher TCF) in known BAW resonators can be compensated for by the invention. The higher coupling makes it possible to obtain resonators having better properties from which frequency-accurate filters having improved properties can be constructed.

In a further configuration of the invention, for the piezoelectric layer use is made of aluminum nitride which is with a material that increases the piezoelectric coupling. In this regard, it is known to increase the piezoelectric coupling by a doping of aluminum nitride by means of yttrium or scandium. The piezoelectric coupling can also be increased with a doping by Mg, Zr and Ti. This makes it possible to further reduce the degradation regarding the piezoelectric coupling, which can be up to 15% even with the proposed compensation layer, such that it is less than 15%. In this way it is possible to use BAW resonators even for such applications which require high filter bandwidths and in which a degradation of the piezoelectric coupling of 15% does not satisfy the specifications. With a correspondingly increased piezoelectric coupling, for example by virtue of the proposed selection of piezoelectric material, there is an increase in the number of possibilities for using the BAW resonators even for demanding applications or for applications with demanding specifications.

In one embodiment, the thickness of the compensation layer is $\lambda/2$ and the thickness of the top low impedance layer is $\lambda/4$. However, it is also possible to set the thickness of the compensation layer to a value of $2\lambda/2$, $3\lambda/2$ or higher, wherein multiples of $\lambda/2$ are always permissible as possible values. A layer thickness of $n\times\lambda/2$ (n=integer) is understood not to be an exact multiple of $\lambda/2$. Rather, it is clear that layer thicknesses which deviate therefrom but which are in the region of $n\times\lambda/2$ are also permissible. What is crucial is that zones having high acoustic stress arise in the compensation layer since the extent of the temperature compensation is proportional to the stress. The zones in which the stress amplitude has a node (zero crossing) thus hardly contribute to the TCF compensation. At the same time care is taken to ensure that the acoustic energy outside the piezoelectric layer does not become excessively high, since otherwise the effective coupling decreases to an excessively great extent.

In the case of the compensation layer according to the invention having a layer thickness of an even multiple of $\lambda/4$, a standing wave builds up in which the antinode of the oscillation having the greatest amplitude lies in the region of the piezoelectric layer, and at the same time a secondary oscillation antinode builds up in the compensation layer. The latter brings about a great to complete compensation of the TCF.

Furthermore, it is evident that the stress amplitude whose square is proportional to the stored acoustic energy, within the compensation layer, is significantly smaller than in known BAW resonators having TCF compensation.

BRIEF DESCRIPTION OF THE DRAWINGS

The invention is explained in greater detail below on the basis of exemplary embodiments and the associated figures. The figures serve solely for illustrating the invention and have therefore been drawn up merely schematically and not as true to scale. Identical or identically acting parts are designated by the same reference signs.

DETAILED DESCRIPTION OF ILLUSTRATIVE EMBODIMENTS

Figure 1:
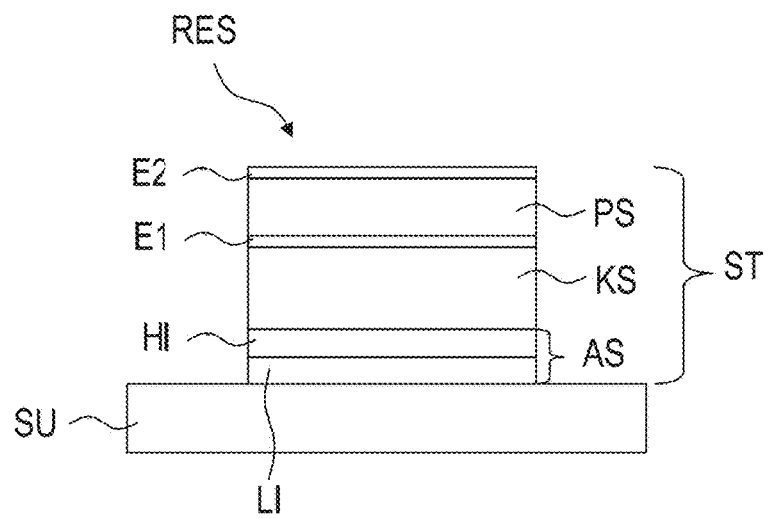
FIG. 1 shows a BAW resonator having a compensation layer using SMR technology in schematic cross section.

FIG. 1 shows a schematic illustration of how a BAW resonator according to the invention can be constructed. The basis is a mechanically stable substrate SU, on which the layer stack for the BAW resonator RES can be deposited. A preferred material is silicon. An acoustic mirror AS comprising at least two mirror layers is deposited directly on the substrate SU. The two mirror layers form a pair of one low impedance layer LI and one high impedance layer HI. Although only two mirror layers are illustrated here, which may be sufficient for the desired reflection, an acoustic mirror known per se generally comprises three to five mirror layers. The mirror effect, or the reflectivity of acoustic waves, rises with the number of mirror layers and is furthermore proportional to the difference in impedance between a high impedance layer HI and a low impedance layer LI. If appropriate, a thin adhesion promoter layer may also be arranged between acoustic mirror AS and substrate SU.

A compensation layer KS is arranged above the acoustic mirror AS, which ends toward the top with a low impedance layer LI. The compensation layer KS has a thickness of $2\lambda/4$, for example. This means that for a given propagation velocity of the acoustic wave three quarters of a total oscillation extend within the topmost low impedance layer and the compensation layer KS. The mirror layers also have a defined layer thickness of approximately $\lambda/4$, which, converted into length units, can mean different values for different materials with a different speed of sound.

Arranged above the compensation layer KS are the first electrode layer E1, thereabove the piezoelectric layer PS and thereabove a second electrode layer E2. Layer thicknesses of E1, PS and E2 are chosen in total such that they correspond to one half of a wavelength. However, since at least part of the acoustic energy is localized within the compensation layer KS, a layer thickness adaptation may be necessary in which the layer thickness of at least one layer from E1, PS and E2 is reduced. However, this is necessary only to a small extent in the case of the BAW resonator according to the invention.

In one preferred embodiment, the substrate is a crystalline silicon substrate, and the low impedance layers LI are chosen from $SiO_2$, while the high impedance layers HI comprise a heavy metal such as tungsten, for example. The compensation layer KS is composed of $SiO_2$, while first and second electrodes E1, E2 can consist of aluminum. However, it is also possible to manufacture the bottom electrode E1 from a heavier metal than aluminum, for example from tungsten. It is also possible for the electrode layers E1 and/or E2 to be composed of a plurality of sublayers, one of which is a layer having a high acoustic impedance, whereas the other has good electrical conductivity. Aluminum nitride is preferably used as the piezoelectric layer PS.

In one embodiment (not illustrated in FIG. 1) it is possible to arrange on the second electrode layer E2 a further compensation layer, which in turn consists of a material having positive temperature coefficients of the viscoelastic properties.

In further embodiments, with the acoustic mirror remaining the same and with the thickness of the compensation layer KS remaining the same, a piezoelectric material having higher piezoelectric coupling than aluminum nitride is used. Although these materials have the disadvantage of a higher TCF, according to the invention the latter can be compensated for by the compensation layer KS, wherein a BAW resonator RES having good to complete TCF compensation in conjunction with sufficiently piezoelectric coupling is obtained.

Figure 2A:
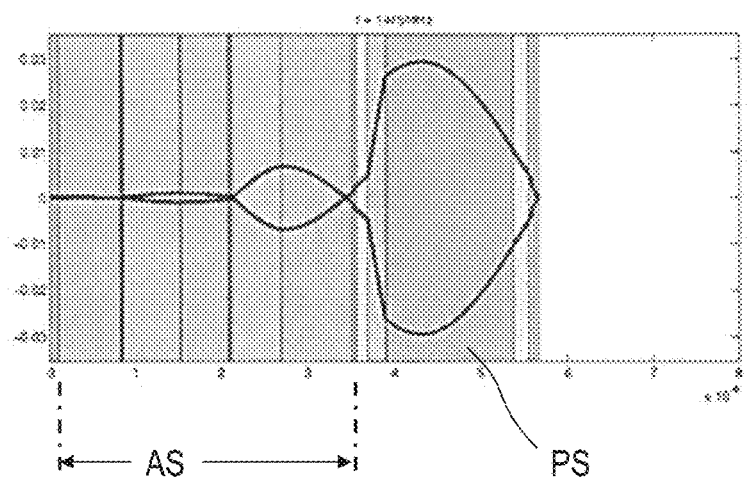
FIGS. 2A to 2C show the stress amplitudes of different BAW resonators in schematic cross section.
Figure 2B:
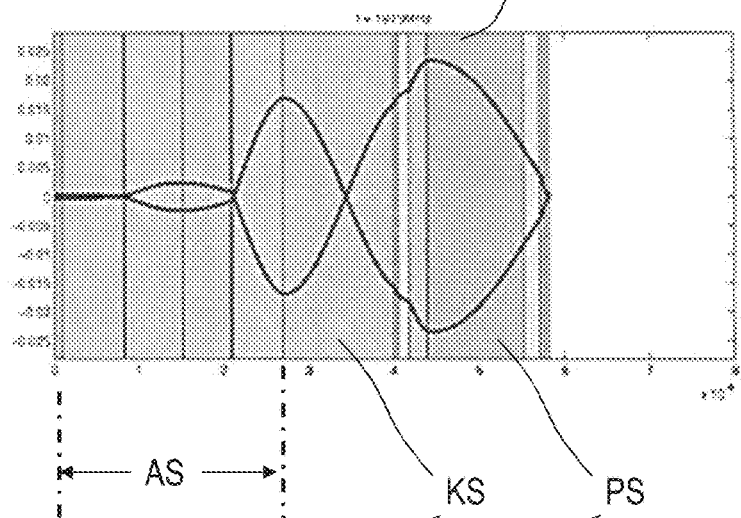
Figure 2C:
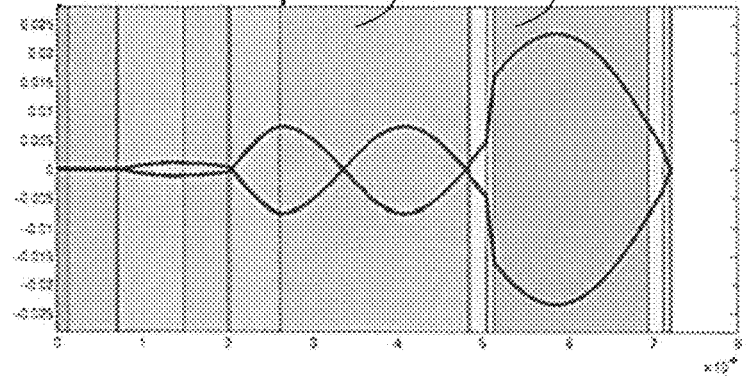

FIGS. 2A to 2C show, on the basis of schematic illustrations, how the acoustic energy is distributed over the layer stack of BAW resonators, wherein known BAW resonators and BAW resonators according to the invention are compared with one another.

FIG. 2A shows a BAW resonator known per se without an additional compensation layer. Here the bottom electrode and thereabove the piezoelectric layer PS are arranged directly above the topmost low impedance layer of the acoustic mirror AS. The stress amplitude for maximum deflection is illustrated within the layer stack. It is evident that all oscillation nodes are arranged at the phase boundaries between mirror layers of the acoustic mirror AS. The largest oscillation antinode progresses on the right within the piezoelectric layer in the figure. Since the acoustic energy is proportional to the square of the stress amplitude illustrated in the figure, the difference in acoustic energy between acoustic mirror and piezoelectric layer is approximately 1:10.

FIG. 2B shows the profile of the stress amplitude for a BAW resonator having a conventional top low impedance layer whose thickness is chosen to be only slightly greater than $\lambda/4$ or which is reinforced by a compensation layer having only a small layer thickness. It is evident that the amplitude ratio is significantly worsened and a large part of the acoustic energy is localized within the acoustic mirror and the compensation layer. A ratio of 1:2 results here for the distribution of the acoustic energy, for which reason the effective coupling of this resonator is greatly degraded.

FIG. 2C shows the profile of the stress amplitude for a BAW resonator according to the invention having a layer thickness of the topmost mirror layer (low impedance layer LI and compensation layer KS are not illustrated separately here) of $3\lambda/4$. It is already evident at first glance here that an improved amplitude ratio is achieved with this embodiment. The stress amplitude within the compensation layer is significantly reduced and the greatest oscillation antinode is positioned practically completely within the piezoelectric layer PS. Compared with a BAW resonator without TCF compensation, as is illustrated in FIG. 2A, the amplitude ratio is only slightly worsened, but greatly improved compared with a known BAW resonator having stress compensation such as is illustrated in FIG. 2B. Since the proportion of the usable acoustic energy which is localized within the piezoelectric layer PS is a measure of piezoelectric coupling, it becomes clear that the BAW resonator according to the invention as illustrated in FIG. 2C, having a thick compensation layer KS, has an improved piezoelectric coupling or a piezoelectric coupling that is reduced by the compensation layer significantly less than the known BAW resonator with TCF compensation.

Similar ratios or similar distributions of the acoustic energy within the BAW resonator according to the invention are obtained if the total thickness of the low impedance layer LI and of the compensation layer KS is 5/4, 7/4 or a higher odd multiple of $\lambda/4$.

Figure 3:
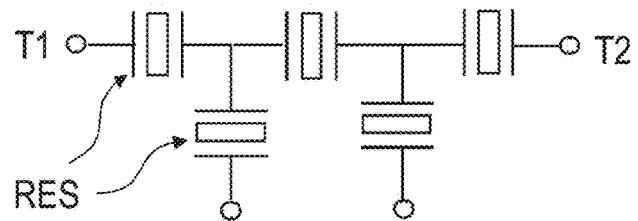
FIG. 3 shows a filter constructed from BAW resonators.

FIG. 3 shows a ladder-type filter produced from resonators that is known per se. Such a filter comprises, in a series branch between a first filter terminal T1 and a second filter terminal T2 a series of here three series-connected resonators that are provided with the compensation layer according to the invention. Here two parallel branches are connected in parallel with said series branch with respect to a reference potential, a respective BAW resonator being arranged in said parallel branches. Since the resonators from which the filter is constructed have a greatly reduced to completely compensated temperature coefficient of the viscoelastic properties, it is possible to construct such a filter with the BAW resonators according to the invention with a temperature drift of the center frequency that is reduced to zero. Thus, a tolerance margin that takes account of the TCF is no longer required. This has the consequence that such a filter as illustrated by way of example in FIG. 3 can now also be used for frequency bands the associated mobile radio systems which have to have a high edge steepness owing to a small band gap between two adjacent bands. Such steep-edge filters can now be obtained with a filter produced from the BAW resonators presented. Further applications for the BAW resonator arise in all other frequency-accurate applications, particularly in the case of oscillators.

In a filter produced from the resonators according to the invention, usually at least the metallic layers of the acoustic mirror AS are structured. The dielectric layers as well as the compensation layer KS can be embodied over the whole area. By structuring the electrode layers E1, E2 and the piezoelectric layer PS during and after deposition it is possible to interconnect a plurality of BAW resonators with one another in the desired manner. In this case, the electrode layers E1, E2 can simultaneously be used for producing the electrical connections between adjacent BAW resonators.

The invention is not restricted to the embodiments illustrated in the exemplary embodiments. Rather, a BAW resonator according to the invention also encompasses embodiments that deviate from those illustrated. The invention does not exclude further functional, auxiliary and intermediate layers from being present in the layer stack besides the layers mentioned, for example adhesion promoting layers at the interface between two different layers comprising different layer materials. The layer thicknesses of such functional layers are usually small and are in the range of between 10 and 150 nm.

Furthermore, a BAW resonator according to the invention or a filter produced from the BAW resonators can be provided with an integrated package. For this purpose, it is possible to bond the substrate with the layer stack facing downward onto a carrier, for example by means of bump connections. It is also possible to place an encapsulation on the substrate SU. Furthermore, it is possible to apply encapsulation layers above the layer stack, which encapsulation layers can comprise a further compensation layer, for example an $SiO_2$ layer.

The invention claimed is:

1. A bulk acoustic wave (BAW) resonator comprising:
a substrate; and
a layer stack disposed thereon, the layer stack comprising:
   a bottom electrode layer;
   a top electrode layer;
   a piezoelectric layer arranged between the bottom and top electrode layers;
   an acoustic mirror arranged between the bottom electrode layer and the substrate, wherein the acoustic mirror comprises at least a high impedance layer and a low impedance layer; and
   a compensation layer comprising a material having a positive temperature coefficient of viscoelastic properties, wherein the compensation layer is arranged between the acoustic mirror and the bottom electrode layer,
wherein a total thickness of a topmost low impedance layer and the compensation layer corresponds to an odd multiple of $\lambda/4$ and is at least $3\lambda/4$, and
wherein $\lambda$ is a wavelength of an acoustic wave to be reflected.

2. The BAW resonator according to claim 1, wherein the compensation layer comprise $SiO_2$ or $GeO_2$ in each case in pure form or enriched with F, P or B.

3. The BAW resonator according to claim 1, wherein the topmost low impedance layer of the acoustic mirror and the compensation layer comprise the same material.

4. The BAW resonator according to claim 1, wherein the piezoelectric layer comprises AlN.

5. The BAW resonator according claim 1, wherein a material of at least one of the high impedance layers is selected from W, Mo, Ta, Pt, Au, $Ta_2O_5$ and Sc.

6. The BAW resonator according to claim 2, wherein a material of at least one of the low impedance layers is selected from Si, $SiO_2$, $GeO_2$, $Si_3N_4$ and an organic layer.

7. The BAW resonator according to claim 1, wherein the bottom electrode layer comprises a material having a higher acoustic impedance than Al.

8. The BAW resonator according to claim 1, wherein the piezoelectric layer comprises a material having a higher piezo-coupling than AlN.

9. The BAW resonator according to claim 8, wherein the material comprises lithium niobate, lithium tantalate, zinc oxide, PZT or sodium potassium niobate.

10. The BAW resonator according to claim 8, wherein the piezoelectric layer includes a doping material for increasing a piezo-coupling.

11. The BAW resonator according to claim 10, wherein the piezoelectric layer comprises doped AlN, and wherein the doping material is Y, Mg, Zr, Ti or Sc.

12. A bulk acoustic wave (BAW) resonator comprising:
a substrate; and
a layer stack disposed thereon, the layer stack comprising:
   a bottom electrode layer;
   a top electrode layer;
   a piezoelectric layer arranged between the bottom and top electrode layers; and
   an acoustic Bragg mirror arranged between the bottom electrode layer and the substrate, wherein the acoustic Bragg mirror comprises at least a high impedance layer and a low impedance layer,
wherein at least one layer arranged between a topmost low impedance layer and the bottom electrode layer comprises a material having a positive temperature coefficient of viscoelastic properties,
wherein a total thickness of the topmost low impedance layer and the at least one layer corresponds to an odd multiple of $\lambda/4$ and is at least $3\lambda/4$, and
wherein $\lambda$ is a wavelength of an acoustic wave to be reflected.

13. The BAW resonator according to claim 12, wherein the at least one layer is adjacent the topmost low impedance layer.

14. The BAW resonator according to claim 1, wherein the compensation layer is adjacent the topmost low impedance layer.

* * * * *